United States Patent
Rohrbeck et al.

[11] Patent Number: 5,883,785
[45] Date of Patent: Mar. 16, 1999

[54] MODULAR ELECTRIC PART FOR A VALVE BLOCK

[75] Inventors: Heribert Rohrbeck, Schwäbish Hall; Martin Ottliczky, Forchtenberg, both of Germany

[73] Assignee: Burkert Werke GmbH & Co., Germany

[21] Appl. No.: 750,564

[22] PCT Filed: Apr. 24, 1996

[86] PCT No.: PCT/EP96/01709

§ 371 Date: Dec. 16, 1996

§ 102(e) Date: Dec. 16, 1996

[87] PCT Pub. No.: WO96/34208

PCT Pub. Date: Oct. 31, 1996

[30] Foreign Application Priority Data

Apr. 27, 1995 [DE] Germany ............... 295 07 119 U

[51] Int. Cl.$^6$ .............. F16K 31/02; H05K 1/14
[52] U.S. Cl. ............... 361/731; 361/679; 361/735; 361/736; 361/784; 361/790; 361/803; 439/76.1; 439/717; 137/884
[58] Field of Search .................... 361/679, 725, 361/726, 729–733, 735, 736, 752, 822, 823, 178; 439/76.1, 717, 928; 200/61.86; 137/487.5, 884

[56] References Cited

U.S. PATENT DOCUMENTS

| | | |
|---|---|---|
| 4,175,820 | 11/1979 | Wilmes et al. .................. 439/76.1 |
| 4,399,836 | 8/1983 | De Versterre et al. ............... 137/487.5 |
| 4,815,496 | 3/1989 | Nishitani et al. ................. 137/884 |
| 5,128,830 | 7/1992 | Deluca et al. .................. 361/724 |
| 5,180,318 | 1/1993 | Moller et al. .................. 439/928 |
| 5,619,013 | 4/1997 | Jorgensen .................. 174/57 |

FOREIGN PATENT DOCUMENTS

| | | | |
|---|---|---|---|
| 0 606 048 A1 | 7/1994 | European Pat. Off. ........ | F15B 13/00 |
| 94 06 393 U | 8/1994 | Germany ........... | F15B 13/08 |
| 43 43 958 A1 | 7/1995 | Germany ........... | F15B 13/08 |
| 683021 A5 | 12/1993 | Switzerland ........ | F15B 13/00 |
| 2 263 154 | 7/1993 | United Kingdom ...... | F15B 13/00 |

*Primary Examiner*—Leo P. Picard
*Assistant Examiner*—John B. Vigushin
*Attorney, Agent, or Firm*—Sixbey, Friedman, Leedom & Ferguson, P.C.; Gerald J. Ferguson, Jr.; Tim L. Brackett, Jr.

[57] ABSTRACT

A modular electric arrangement for central power supply and control of valves in a valve block including at least one base module having a housing with tow opposed open ends, at least one connection module, and at least one termination module; the base, connection and termination modules having an identical cross-sectional configuration and being releasably connected in-line; the base module accommodating a circuit board and having a side wall with at least one opening therein for access to a connector on the circuit board; the connection module providing a central electric power supply for other modules in the arrangement; and the termination module closing an open end of an adjacent module in the arrangement.

18 Claims, 4 Drawing Sheets

MODULAR ELECTRIC PART FOR A VALVE BLOCK

BACKGROUND OF THE INVENTION

1. Field of the Invention

The invention relates to a modular electric part for the central power-supply and/or signal-control of valves assigned to a valve block.

2. Description of the Related Art

Modular configured valve blocks are already known. These, however, have in particular the disadvantage that a plurality of differing components needs to be made available for various applications, valve sizes and valve arrangements. Thus, for instance, each such valve block always needs to be conceived for a highly specific valve size, resulting in cost-intensive production and stockage.

SUMMARY OF THE INVENTION

The object of the invention is to define a modular electric part of the aforementioned kind which can be composed of a few elementary components and thus adapted with no problem to differing requirements such as in particular to a changing number of valves to be connected and/or connecting valves of different kinds.

This object is achieved according to the invention in that the modular electric part includes at least one base module having a housing open at its two opposing ends, into which a circuit board having one or more terminal contacts is inserted, one housing sidewall being provided with at least one knockout, through which a corresponding valve or some other actor is connectable to at least one assigned terminal contact, and containing at least one connecting module serving the central power-supply and/or signal-control as well as at least one termination module, and in that the modules are identical cross-sectionally and able to be connected and released to/from each other in-line, where necessary, by producing respective electrical interconnections or an end closure.

As a result of this configuration the electrical part can be composed by simple means on the basis of a minimum number of standard modules to create a system optimally adapted to the respective application. The number of differing modules is restricted to an electrical base module, an electrical connecting module and to a termination module in each case for the one and other end of each row of modules. Where necessary, several base modules may be mounted in-line, the number of base modules mounted in-line being restricted at the most by the signal-control arrangement.

Depending on the application each of the base modules may be provided with a differing number of terminal contacts and assigned knockouts from one another and/or knockouts differing in number and/or size. These knockouts may be knocked out of corresponding base modules by simple means.

The base module may to advantage also feature free electrical outputs which in turn are powered and/or signal-controlled via a connecting module. These free outputs may be made use of for optional applications such as e.g. connecting an audible alarm or the like.

In accordance with a particularly advantageous embodiment the modular electric part comprises at least one feedback module mountable, where necessary, on a corresponding base module, releasably connectable thereto which furnishes the feedback signals regarding the valves. Thus, since the base module and the feedback module are no longer configured as a unit but separately the feedback modules may be inserted or omitted as necessary, in the second case the space requirements being additionally reduced. For closed circuit controls necessitating a feedback signal of the actual status by sensors, the valve block may be expanded by feedback modules, dedicated to the valves, which contain the sensoric arrangement.

Regarding its type the electrical connecting module may be selected according to the application and, for instance, configured by means of a connecting module featuring neutral and around terminals, as a multipin connector or also as a connecting module assigned to a field bus module. In the case of the connection of a multipin module having a multipin connector a 1:1 wiring arrangement may be provided, whereas in the case of higher requirements on signal-control a field bus module may be connected. Basically, however, further modules may also be integrated, particularly for free inputs, free outputs, small-signal control arrangements or a storage-programmed system (SPS).

The electrical part in accordance with the invention is also particularly suitable with no problem in the case of a connection of pulsed valves requiring two electrical inputs for their functioning. In this case it is expediently provided for that one knockout for connecting such a pulsed valve or the like is assigned two terminal contacts in each case.

Due to the circuit board configuration according to the invention as set forth in claim 18 the base modules and/or feedback modules may be directly replaced by other modules which, for example, may be designed for a different number of valves or differing valve sizes. Due to the cited conductor array it is assured that the required sequence of connections is always maintained.

In accordance with the invention the modules may thus be connected to each other simply by being connected together and disconnected from each other again, as necessary, with no problem. This makes simple and speedy replacement of the modules possible, as a result of which the circumstances are taken into account that faults occur particularly in the electrical part of the valve block. When a defect occurs the module concerned can be replaced by another simply and speedily.

Since the electrical connection of the valve block is replaceable, its type of connection may also be changed at some later date.

Further advantageous embodiments of the invention are set forth in the sub-claims.

BRIEF DESCRIPTION OF THE DRAWINGS

The invention will now be described in more detail in the following on the basis of example embodiments with respect to the drawing in which

FIGS. 1 to 3 show embodiments of a modular electric part 10 of a valve block (not shown) comprising the valves including the valve drives and a pneumatic base rail for the supply and discharge of a pressure medium.

DESCRIPTION OF PREFERRED EMBODIMENTS

Figure 1:
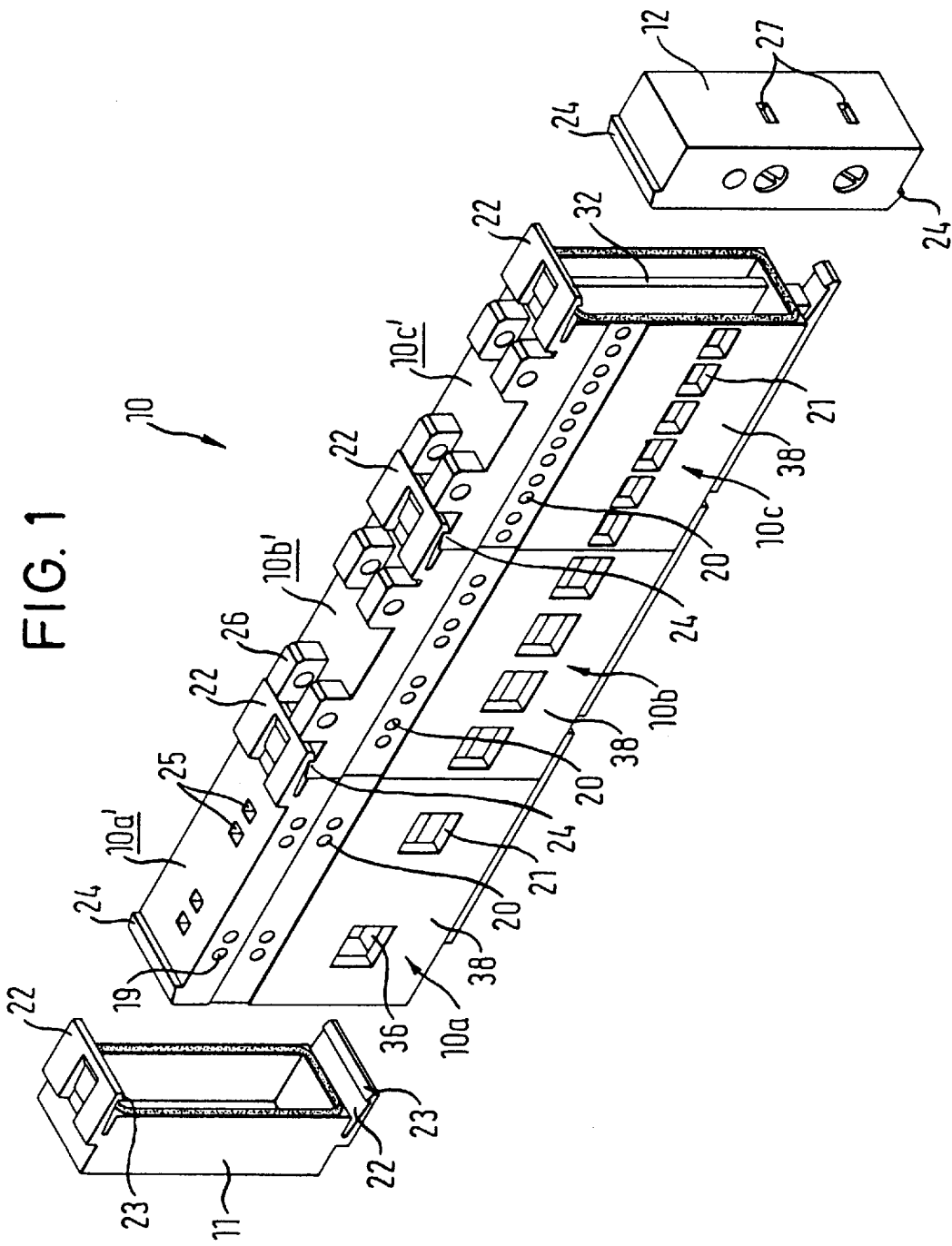
FIG. 1 is an exploded view of an electrical part of a valve block comprising three electrical base modules, an electrical connecting module and a termination module.

This modular electric part 10 serving the central power-supply and/or signal-control of the valves assigned to the valve block includes three base modules 10a, 10b, 10c. Each of these base modules 10a, 10b, 10c has a housing 10a', 10b', 10c' open at its two opposing ends, into each of which a circuit board 32 having at least one terminal contact 36 (cf. also FIG. 4) is inserted. Where necessary, each terminal contact 36 is assigned a knockout 21 provided in the housing wall 38 expediently located facing the corresponding terminal contact and a neutral lead contact. Principally also several terminal contacts 36 having an assigned neutral lead contact may be located facing each knockout 21 to permit also in particular pulsed valves to be connected, having two connections. A corresponding valve is then connectable through the assigned knockout 21 to the corresponding number of assigned terminal contacts 36.

The left-hand base module 10a is provided with two identical large knockouts 21, the middle base module 10b with four knockouts 21 the same in size and the right-hand base module 10c with six knockouts 21 which although smaller than the knockouts of the previous modules are nevertheless identical to each other in size. Each of these knockouts 21 serves as the connector location for a corresponding valve.

Furthermore, each of the base modules 10a, 10b, 10c has an LED indicator 20 for indicating the function. The left-hand base module 10a is, in addition, provided with terminals 19 for electrically connecting the valve drives to the corresponding circuit board 32. On the upper side of this base module 10a knockouts 25 are further provided from which electrical power-supply leads can be brought out.

Figure 2:
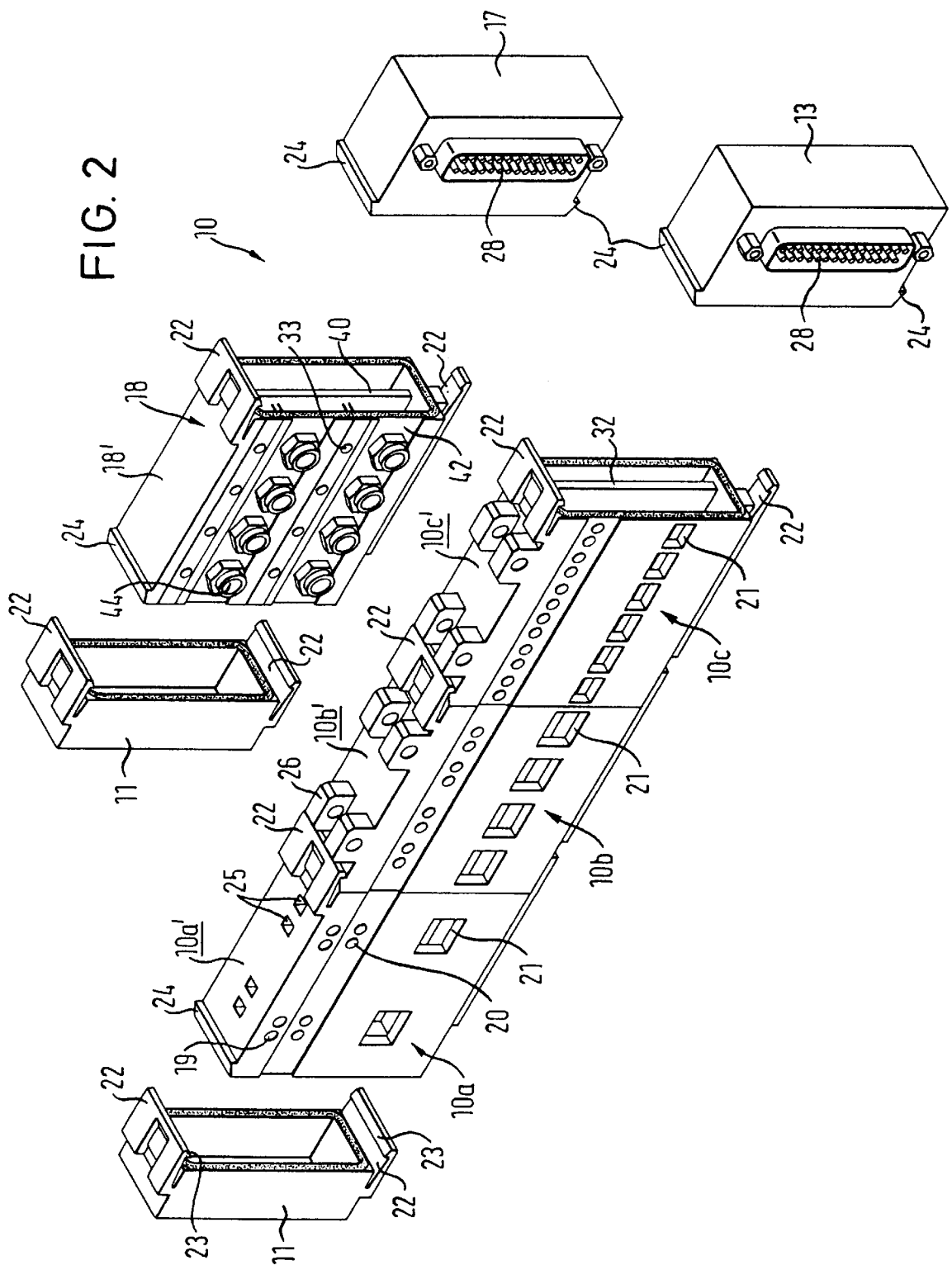
FIG. 2 is an exploded view of an electrical part of a valve block comprising an additional feedback module, which in turn assigned an electrical connecting module and a termination module.
Figure 3:
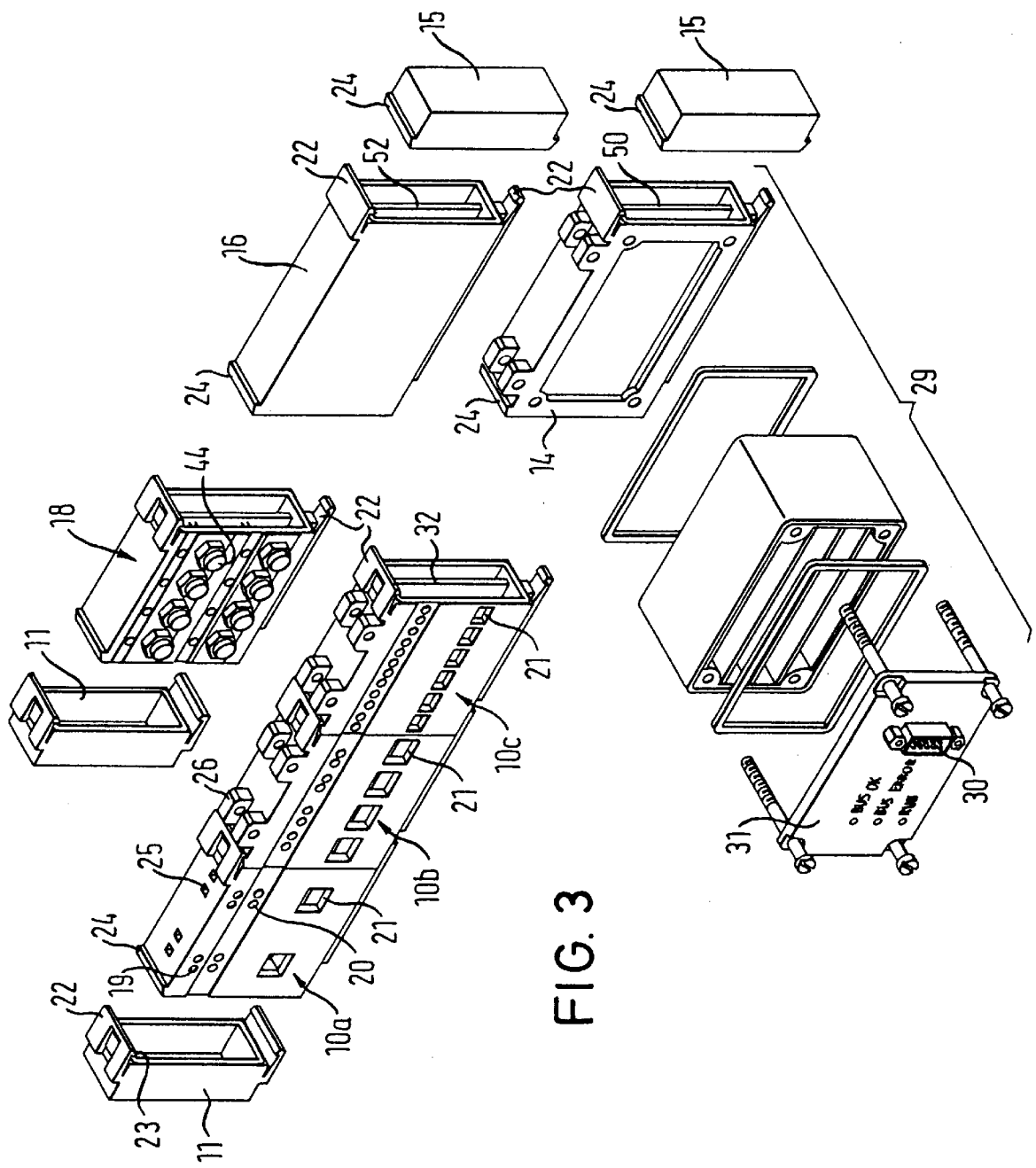
FIG. 3 is an exploded view of an electrical part of a valve block comprising a field bus module connectable to the base module row.

The modular electric part 10 represented in FIGS. 1 to 3 includes further a connecting module 12, 13, 14 serving the central power-supply and/or signal-control, as well as at least one termination module 11, 15 for the left-hand and right-hand side of each row of modules respectively.

The modules 10a, 10b, 10c; 12, 13, 14; 11, 15 are identical in cross-section, they being, where necessary, connectable in-line and releasable from each other by production of electrical interconnections in each case or an end closure respectively.

In the embodiments shown, each of the modules may be connected to the other releasably via a snap-action connector 22–24. Each of these snap-action connectors comprises a tongue 22 including a latching nose 23 and a projection 24 on the adjacent module interacting with the latching nose. Whilst the termination modules 11 provided for the left-hand side in the example embodiments shown are provided merely with tongues 22 and latching noses 23, each of the right-hand termination modules 15 as well as the electrical connecting elements 12 and 13 is merely provided with a projection 24.

Each base module 10a, 10b, 10c may feature free electrical outputs, in a manner to be described later, which are powered and/or signal-controlled via a connecting module 12, 13, 14.

In the case of the example embodiment shown in FIG. 1 a connecting module 12 comprising neutral and ground conductors connections 27 for the electrical power-supply and/or signal-control of the valves and, where necessary, the free electrical outputs is provided, whereas in the case of the connecting module 13 in the version as shown in FIG. 2 a multipin connector 13 is involved which is provided with a multipin connector 28. In accordance with FIG. 3 for the electrical power-supply and/or signal-control of the valves and, where necessary, the free electrical outputs a connecting module 14 is provided assigned to a field bus module 29, which may in turn include an inserted circuit board 50, like a base module, and configured with tongues 22 and latching noses 23, this connecting module 14 permitting closure from the environment, for example, by a termination module 15. The field bus module 29 is provided with a cover 31 on which a bus connector 30 is mounted.

In the case of the example embodiments shown, the electrical signals necessary for actuating the valves are controlled externally. The connecting module 12, 13, 14 in each case for the electrical power-supply and/or signal-control of the valves and, where necessary, the free electrical outputs may principally also include a small signal-control. Furthermore, it is conceivable to connect several connecting modules, each containing a small signal-control.

In the case of the embodiments shown in FIGS. 2 and 3 a feedback module 18 is provided mountable on each base module 10a, 10b, 10c, where necessary, releasably connectable via connector elements 26 thereto, this feedback module permitting the feedback of sensor signals from the valves. For processing these signals further, each feedback module 18 is connectable to an electrical feedback connecting module 17 and 16 respectively. The feedback connecting module 17 of the embodiment shown in FIG. 2, like the connecting module 13, is configured in turn as a multipin connector having a multipin connector 28 and projections 24, whereas the feedback connecting module 16 shown in FIG. 3 has in turn generally the configuration of a base module with a housing provided, on the one hand, with projections 24 and, on the other, with tongues 22, into said housing a circuit board 52 being inserted.

The feedback module 18 shown in FIGS. 2 and 3 also features, like a base module, a housing 18' open at its two ends into which a circuit board 40 having one or more contacts is inserted. Each of these contacts is connectable to a terminal 44 provided in a housing sidewall 42 for, in particular, sensors. In addition to this the feedback module 18 and the feedback connecting module 16 or 17 in each case and the assigned termination modules 11, 15 are in turn identical in cross-section so that they, where necessary, can be fitted in-line, producing electrical interconnections in each case or an end closure and can be releasably connected to each other via the snap-action connections 22–24.

The terminals 44 may be configured as round plug connections, screw terminals or some other kind of electrical connection.

In addition, the feedback module 18 and the feedback connecting modules 16, 17 are identical in cross-section to that of the base modules 10a, 10b, 10c or of a connecting module 12, 13, 14 for in-line mounting to the base modules or connecting module. The termination modules 11, 15 assigned to each of the row of base modules or each of the row of feedback modules, are configured identical and thus interchangeable.

The connection between the modules stacked one on the other such as, for example, between a base module 10a, 10b, 10c and the feedback module 18 is made expediently via the connecting elements 26 and screws (not shown).

Whilst e.g. in the case of the embodiment shown in FIG. 2 the coupling of the valves to the control is made by the multipin connector 13, in the case of the variant shown in FIG. 3 the valves are controlled via the field bus 29.

Figure 4:
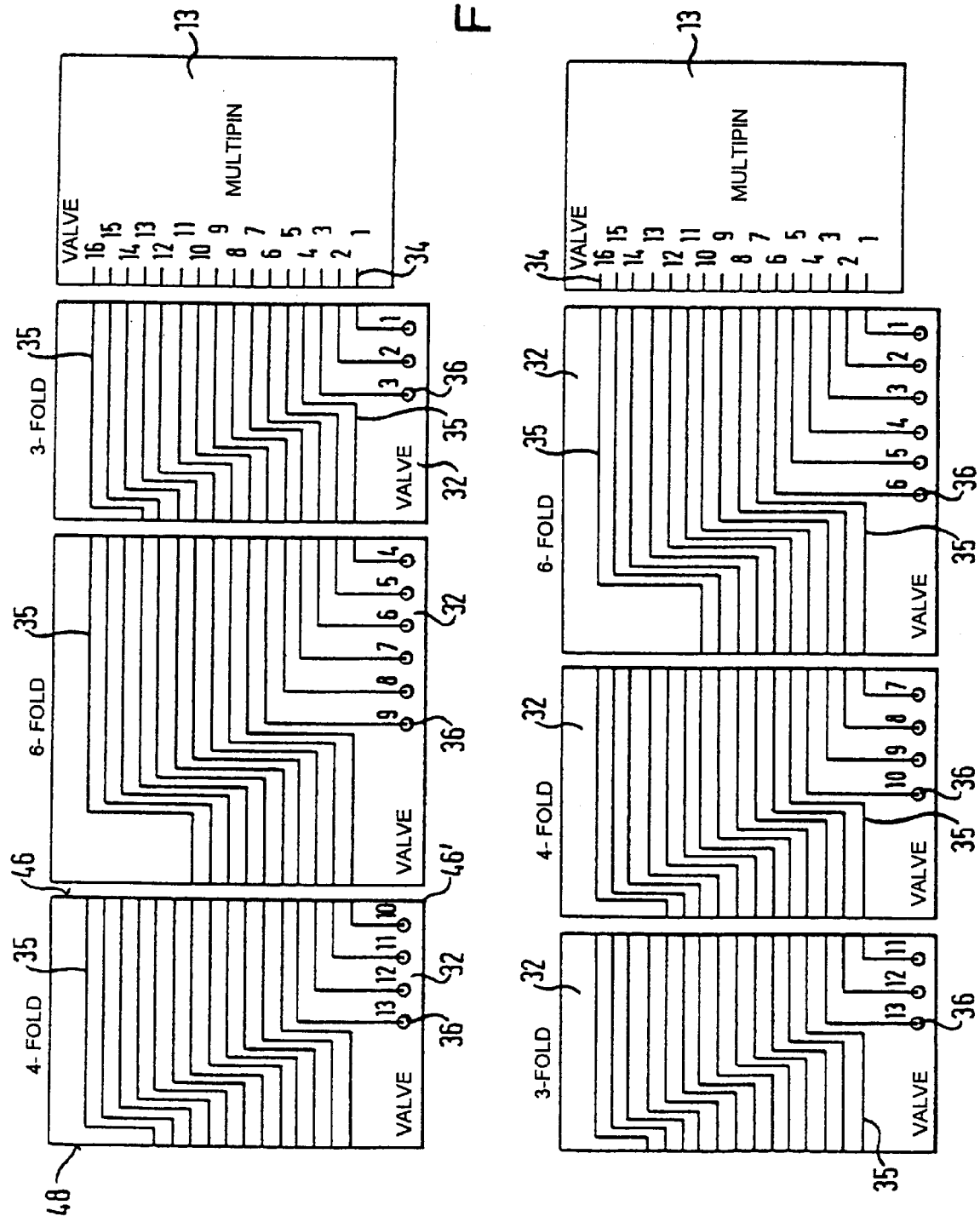
FIG. 4 is a schematic representation for explaining the principle of the conductor array on the various circuit boards.

As evident from FIG. 4 the circuit boards 32 assigned to the base modules 10a, 10b, 10c have the same number of conductor paths 35 parallel to each other at least sectionwise which starting from the right-hand board edge 46 at the input end are guided to the opposite left-hand board edge 48 at the output end or are branched off on the side downwards to terminal contacts 36. The conductor paths located nearest to the lower end 46' of the right-hand input.end board edge 46 are guided, beginning with the lowermost path, in sequence in a number corresponding to the number of terminal contacts 36 to the terminal contacts 36, whilst the remaining conductor paths at the left-hand board edge 48 at the output end are staggered so that they are oriented with respect to the conductor path sections located nearest to the lower end 46' of the board edge 46 at the input end.

The paths adjoining the conductor paths connected upwards to the terminals 36 thus serve to produce a connection to the terminals 36 of an adjoining circuit board 32 or as free terminals as already mentioned. Accordingly, the conductor paths 35 not required for the terminals 36 of each circuit board 32 are thus brought out so that, in turn, the lower conductor paths 35 produce the connection to the terminals 36 of the next circuit board 32. At the upper end of the next circuit board 32, always the same number of conductor paths 35 remains uncontacted as is eliminated by the terminals 36 of the preceding circuit board 32. In FIG. 4 the neutral conductor contacts needed for closing a circuit in each case are not shown.

To make it clear that this principle is possible in every combination, the sequence of the circuit boards has been changed in FIG. 4. Whilst in the upper module row of FIG. 4 three circuit boards 32 having four, six and three valve terminals 36, respectively, are connected in series, in the lower module row three circuit boards 32 having three, four and six terminals, respectively, are connected in series. At each right-hand end of these two rows an electrical connecting module 13 configured as a multipin connector is provided having a number of terminals 34 corresponding to the number of conductor paths provided on the circuit boards.

The housings of the individual components of the electrical part are made preferably of a plastics material, however, any other suitable material is basically feasible.

We claim:

1. A modular electric arrangement for central power supply and control of valves in a valve block, comprising:
   at least one base module having a housing with two opposed open ends,
   at least one connection module, and
   at least one termination module;
   said base, connection and termination modules having an identical cross-sectional configuration and being releasably connected in-line;
   said base module accommodating a circuit board and having a side wall with at least one opening therein for access to a connector on said circuit board;
   said connection module providing a central electric power supply for other modules in the arrangement;
   and said termination module closing an open end of an adjacent module in the arrangement.

2. The modular electric arrangement as set forth in claim 1, wherein each of said modules is able to be releasably connected to each other via a snap-action connector.

3. The modular electric arrangement as set forth in claims 1 or 2, wherein each of said base modules has a different number of terminal contacts from one another and assigned knockouts are provided.

4. The modular electric arrangement as set forth in claims 1 or 2, wherein each of said base modules is provided with a different number and/or size of knockouts from one another.

5. The modular electric arrangement as set forth in claims 1 or 2, wherein said base module comprises free electrical outputs which are power-supplied and/or signal-controlled via said connection module.

6. The modular electric arrangement as set forth in claims 1 or 2, including at least one feedback module mountable, where necessary, on a respective base module and adapted to be releasably connected thereto to thereby furnish feedback signals regarding the valves.

7. The modular electric arrangement as set forth in claim 6, including at least one feedback connecting module for in-line mounting to said feedback module and releasably connectable thereto in producing respective electrical interconnections as required.

8. The modular electric arrangement as set forth in claim 5 wherein for the electrical power-supply and/or signal-control of said valves and of said free electrical outputs, where necessary, said connection module comprising neutral and ground conductors is provided.

9. The modular electric arrangement as set forth in claim 5 wherein a multipin connector is provided as said connection module for the electrical power-supply and/or signal-control of said valves and, where necessary, the free electrical outputs and/or as said feedback connecting module.

10. The modular electric arrangement as set forth in claim 5 wherein said connection module is assigned to a field bus module and is provided for the electrical power-supply and/or signal-control of said valves and, where necessary, the free electrical outputs.

11. The modular electric arrangement as set forth in claim 5 wherein said connection module for the electrical power-supply and/or signal-control of said valves and, where necessary, the free electrical outputs includes a small-signal-control.

12. The modular electric arrangement as set forth in claim 11, wherein several connection modules are provided, each including a small-signal-control.

13. The modular electric arrangement as set forth in claims 1 or 2 wherein one or more of said connection modules are provided, forming connections to external controls.

14. The modular electric arrangement as set forth in claim 7 wherein said feedback module includes a housing open at its two opposing ends, into which a circuit board having one or more contacts is inserted, each of which is connectable to a terminal provided in a housing sidewall, and wherein said feedback module, said feedback connecting module and assigned termination modules are identical cross-sectionally and able to be connected and released to/from each other in-line, where necessary, thereby producing respective electrical interconnections or an end closure.

15. The modular electric arrangement as set forth in claim 14 wherein said feedback module and said feedback connecting module are identical cross-sectionally to the base module or to said connection module for in-line mounting to the base module or said connection module, and wherein at least said termination modules assigned to each row of base modules or each row of feedback modules are configured identically and thus are interchangeable.

16. The modular electric arrangement as set forth in claim 8 wherein at least one terminal contact each and one neutral conductor contact face a knockout.

17. The modular electric arrangement as set forth in claims 1 or 2 wherein at least two terminal contacts each face a knockout for connecting a pulsed valve.

18. The modular electric arrangement as set forth in claim 14 wherein said circuit boards assigned to said base modules and/or said feedback modules have the same number of conductor paths parallel to each other at least sectionwise which starting from a board edge at the input end are guided to the opposite board edge at the output end or are branched off on the side to terminal contacts, the conductor paths located nearest to one end of the input end board edge being guided, beginning with the path adjacent to the end, in sequence in a number corresponding to the number of terminal contacts to said terminal contacts, while the remaining conductor paths at the output-end board edge are staggered so that they are oriented with respect to the conductor path sections located nearest to the one end of the board edge at the input end.

* * * * *